United States Patent
Hashimoto et al.

(10) Patent No.: US 7,871,691 B2
(45) Date of Patent: Jan. 18, 2011

(54) ORIENTED POLYESTER FILM

(75) Inventors: Katsuyuki Hashimoto, Gifu (JP); Tetsuo Yoshida, Gifu (JP); Makoto Tsuji, Gifu (JP); Shinya Togano, Gifu (JP)

(73) Assignee: Teijin Dupont Films Japan Limited, Tokyo (JP)

( * ) Notice: Subject to any disclaimer, the term of this patent is extended or adjusted under 35 U.S.C. 154(b) by 803 days.

(21) Appl. No.: 11/596,476

(22) PCT Filed: May 12, 2005

(86) PCT No.: PCT/JP2005/009113
§ 371 (c)(1),
(2), (4) Date: Nov. 13, 2006

(87) PCT Pub. No.: WO2005/110718
PCT Pub. Date: Nov. 24, 2005

(65) Prior Publication Data
US 2008/0032144 A1 Feb. 7, 2008

(30) Foreign Application Priority Data
May 14, 2004 (JP) ............................. 2004-144609

(51) Int. Cl.
*B32B 7/02* (2006.01)
*B32B 27/18* (2006.01)
*B32B 27/20* (2006.01)
*B32B 27/36* (2006.01)

(52) U.S. Cl. ............... 428/141; 428/212; 428/213; 428/215; 428/332; 428/339; 428/480; 428/910; 428/847; 428/847.3; 428/847.5; 428/847.7

(58) Field of Classification Search .................. None
See application file for complete search history.

(56) References Cited

U.S. PATENT DOCUMENTS 5,372,871 A * 12/1994 Takase et al. ............... 428/209
5,534,323 A * 7/1996 Chuujou et al. ........... 428/847.3

(Continued)

FOREIGN PATENT DOCUMENTS

EP 0 593 773 A1 4/1994

(Continued)

OTHER PUBLICATIONS

English Translation of JP 2001-191405A.*

*Primary Examiner*—Vivian Chen
(74) *Attorney, Agent, or Firm*—Sughrue Mion, PLLC

(57) ABSTRACT

An object of the invention is to provide such an oriented polyester film that has a constant thickness, and is excellent in dimensional stability at a high temperature and dimensional stability to temperature change in a working temperature range. The invention relates to an oriented polyester film containing as a major component of a substrate layer polyethylene -2,6-naphthalene dicarboxylate, being stretched at least in one direction, and having a film thickness of from 12 to 250 μm, wherein
(1) a coefficient of linear thermal expansion $\alpha t$ at a temperature of from 30 to 100° C. is from 0 to 15 ppm/° C. in both longitudinal and width directions of the film, and
(2) a thermal shrinkage rate at 100° C. for 10 minutes is 0.5% or less in both longitudinal and width directions of the film.

11 Claims, 1 Drawing Sheet

U.S. PATENT DOCUMENTS

| | | | |
|---|---|---|---|
| 5,976,668 A * | 11/1999 | Chiba et al. | 428/141 |
| 6,274,225 B1 * | 8/2001 | Miyake et al. | 428/209 |
| 6,338,890 B1 * | 1/2002 | Kobayashi et al. | 428/141 |
| 6,704,080 B2 * | 3/2004 | Hara | 349/113 |
| 6,890,471 B2 * | 5/2005 | Kobayashi et al. | 264/290.2 |
| 6,987,354 B2 * | 1/2006 | Arakawa et al. | 313/506 |
| 7,022,388 B2 * | 4/2006 | Hashimoto et al. | 428/34.9 |
| 7,101,627 B2 * | 9/2006 | MacDonald et al. | 428/480 |
| 7,122,241 B2 * | 10/2006 | Kobayashi et al. | 428/141 |
| 2004/0265539 A1 * | 12/2004 | Hashimoto et al. | 428/141 |
| 2005/0238871 A1 * | 10/2005 | Robinson et al. | 428/331 |
| 2009/0011228 A1 * | 1/2009 | Eveson et al. | 428/336 |
| 2010/0189998 A1 * | 7/2010 | MacKerron et al. | 428/336 |

FOREIGN PATENT DOCUMENTS

| | | | |
|---|---|---|---|
| EP | 0 982 115 A1 | | 3/2000 |
| EP | 1 029 704 A1 | | 8/2000 |
| EP | 1 120 225 | * | 8/2001 |
| EP | 1 510 540 A1 | | 3/2005 |
| JP | 62-82511 A | | 4/1987 |
| JP | 10-16167 | | 1/1998 |
| JP | 10-034742 | * | 2/1998 |
| JP | 11-168267 | * | 6/1999 |
| JP | 11-279293 | | 10/1999 |
| JP | 2000-85082 A | | 3/2000 |
| JP | 2001-11209 A | | 1/2001 |
| JP | 2001-191405 | * | 7/2001 |
| JP | 2001191405 A | * | 7/2001 |
| JP | 2002-018947 A | | 1/2002 |
| JP | 2002-205332 A | | 7/2002 |
| JP | 2004-9362 A | | 1/2004 |
| JP | 2004-009362 A | | 1/2004 |
| WO | WO 93/20553 A1 | | 10/1993 |
| WO | WO 99/29488 A1 | | 6/1999 |
| WO | WO 03/022575 | * | 3/2003 |
| WO | WO 03/102057 | * | 12/2003 |

* cited by examiner

ORIENTED POLYESTER FILM

TECHNICAL FIELD

The present invention relates to such an oriented polyester film that is excellent in dimensional stability at a high temperature and dimensional stability to temperature change in a working temperature range. More specifically, it relates to such an oriented polyester film that is excellent in dimensional stability at a high temperature and dimensional stability to temperature change in a working temperature range, and is excellent in transparency and high flatness. The invention further relates to a flexible electronics device substrate and a flexible electronics device that contain an oriented polyester film excellent in dimensional stability.

BACKGROUND ART

A polyester film, in particular a biaxially stretched film of polyethylene terephthalate, polyethylene naphthalate or the like, is widely used as a material of a magnetic tape, a ferromagnetic thin film tape, a photographic film, a wrapping film, an electronics part film, an electrically insulating film, a film for lamination with a metal, a glass display and the like, since it is excellent in mechanical property, heat resistance and chemical resistance.

In an image display device referred to as a flat panel display, which is represented by a liquid crystal display, a glass substrate is used as a supporting substrate for various kinds of functional layers, such as a display element and a transparent electrode. In recent years, however, an image display device is demanded to have a low-profile, a lightweight, a large screen size, a flexibility in shape, a curved display and the like, and therefore, it is being considered to use a highly transparent polymer film substrate having a light weight and flexibility instead of a glass substrate, which has a heavy weight and is liable to be broken.

In an image display device, a liquid crystal display requires a large number of parts since a backlight is necessarily employed, but a self-emitting device, which is represented by an organic EL, is being positively developed since it can be fabricated with a small number of parts. Such a demand is increased in this purpose that the breakable property and the heavy weight, as the defects of glass, are eliminated to attain flexibility, and thus a polymer film is being employed therein.

The polymer film has, depending on purposes, various functional layers, such as a gas barrier layer, a conductor layer, a semiconductor layer and a luminescent layer, laminated. The functional layers are laminated by such a method as vapor deposition, ion plating, sputtering and plasma CVD. While the temperature varies depending on the lamination method, the polymer film is exposed to a significantly high temperature, and therefore, the polymer film suffers, in some cases, thermal expansion due to temperature change or thermal shrinkage due to a heat treatment at a high temperature. In particular, the dimensional stability to temperature change is one of important characteristics also in a glass substrate, and a low coefficient of linear thermal expansion is being demanded. However, the rate of dimensional change of a polymer film is larger than glass, and is liable to be different from the dimensional change rates of the functional layers. As a result, upon laminating the functional layer to the film or after laminating the functional layer thereto, there arises such a problem that the laminated product is broken due to cracks or wrinkles occurring therein, whereby the functional layers fail to exert the intended functions.

A flexible printed circuit is an electric circuit disposed on a substrate having flexibility, and is formed by adhering a metallic foil to a film as a substrate, or applying plating or the like to the film, and then subjecting the substrate to etching. The substrate having a circuit formed thereon is further subjected to a heat treatment, mounting of circuit parts, and the like, so as to be used practically as an electric or electronics apparatus. In recent years, a portable electric or electronics apparatus, such as a notebook personal computer and a mobile phone, is being spread rapidly, and miniaturization of the apparatus is also being practiced. However, the apparatus having been miniaturized is still demanded to have such functions that are equivalent to or higher than those of the conventional ones, and accordingly, the circuit is demanded to have a small size and a high density. Furthermore, while a demand of price reduction is being increased, a polyimide film, which has been used as a film for a flexible circuit substrate, is expensive and suffers a large dimensional change upon absorbing moisture, and thus, a polymer film as a substitute of a polyamide film is being investigated. A polymer film for a flexible printed circuit substrate is also demanded to have dimensional stability at a high temperature and a small dimensional distortion caused by coefficients of linear thermal expansion between a metallic foil and the substrate film, as similar to the substrate for an image display device.

As for the dimensional stability of a polyester film at a high temperature, JP-A-2004-009362 discloses a polyester film that is controlled in thermal shrinkage rate to have transparency. According to the method, however, the coefficient of linear thermal expansion in a working temperature range is still large although it is excellent in dimensional stability at a high temperature.

JP-A-2002-018947 discloses that a biaxially stretched film having a coefficient of linear thermal expansion and a humidity expansion coefficient in particular ranges is subjected to a thermal relaxing treatment once or more to provide a biaxially stretched polyester film for a photographic light-sensitive material excellent in thermal shrinkage rate. However, JP-A-2002-018947 discloses the thermal relaxing treatment at a high temperature for decreasing the thermal shrinkage rate at 120° C., which is required in a photographic light-sensitive material, and the coefficient of linear thermal expansion is rather deteriorated although the thermal shrinkage rate is improved by the method.

As a result of reduction in thickness of a magnetic recording medium, such as a magnetic tape, associated with miniaturization and prolongation of recording time, shrinkage in the width direction is liable to occur with elongation deformation in the longitudinal direction, which brings about, for example, deviation in recording tracks. In order to avoid the problem, JP-A-2002-205332 discloses such a polyester film that has a coefficient of linear thermal expansion in the film width direction at room temperature to 50° C. in a range of from 0 to 12 ppm/° C. and a thermal shrinkage rate in the film width direction at 100° C. in a range of from 0 to 0.3%, and also discloses a preferred film thickness in a range of from 3 to 7 μm. However, JP-A-2002-205332 intends to control the coefficient of linear thermal expansion in a relatively gentle temperature range of from room temperature to 50° C., and notes that the coefficient of linear thermal expansion in the film longitudinal direction is preferably a negative coefficient of linear thermal expansion, i.e., is preferably in direction of shrinkage. JP-A-11-279293 discloses such a film for a magnetic recording medium as a major purpose that has coefficients of linear thermal expansion and humidity expansion coefficients in the film longitudinal and width directions and a thermal shrinkage rate at 65° C. in prescribed ranges and has a film thickness of 7 μm or less. However, JP-A-11-279293 only discloses preferred relationship among the characteristics but does not disclose specific ranges for the coefficients of linear thermal expansion, and only a negative coefficient of linear thermal expansion in the longitudinal direction is disclosed in the example.

As having been described, it is the current situation that it is difficult to obtain such a film that is excellent in dimensional stability of both a thermal shrinkage rate and a coefficient of linear thermal expansion in the film longitudinal and width directions.

DISCLOSURE OF THE INVENTION

A first object of the invention is to provide such an oriented polyester film that is suitable for a supporting substrate of a flexible electronics device, has a constant thickness, and is excellent in dimensional stability at a high temperature and dimensional stability to temperature change in a working temperature range.

A second object of the invention is to provide such an oriented polyester film that is excellent in dimensional stability at a high temperature and dimensional stability to temperature change in a working temperature range, and has both transparency and high flatness.

A third object of the invention is to provide a flexible electronics device substrate, such as a liquid crystal display, an organic EL display, electronics paper, a dye sensitized solar cell and a flexible printed circuit, containing an oriented polyester film excellent in dimensional stability, and a flexible electronics device containing the flexible electronics device substrate.

As a result of earnest investigations by the inventors for solving the aforementioned problems, it has been found that a flexible electronics device substrate having excellent dimensional stability not only at a high temperature but also to temperature change in a working temperature range can be obtained by using an oriented polyester film containing as a major component of a substrate layer polyethylene-2,6-naphthalene dicarboxylate and having a film thickness of from 12 to 250 μm, wherein the polyester film has coefficients of linear thermal expansion in the film longitudinal and width directions in a temperature range of from room temperature to 100° C. and thermal shrinkage rates in the film longitudinal and width directions at 100° C. within particular ranges, and thus the invention has been completed.

The invention relates to an oriented polyester film stretched in at least one direction, containing as a major component of a substrate layer polyethylene-2,6-naphthalene dicarboxylate, and having a film thickness of from 12 to 250 μm, wherein (1) a coefficient of linear thermal expansion $\alpha t$ at a temperature of from 30 to 100° C. is from 0 to 15 ppm/° C. in both longitudinal and width directions of the film, and (2) a thermal shrinkage rate at 100° C. for 10 minutes is 0.5% or less in both longitudinal and width directions of the film.

As a preferred embodiment, the oriented polyester film of the invention encompasses an embodiment having at least one of a total light transmittance of the film of 85% or more, a haze of 1.5% or less, a three-dimensional center line average roughness SRa on one surface of the film of from 5 to 20 nm, and a three-dimensional center line average roughness SRa on the other surface of the film of from 0 to 5 nm.

The invention encompasses a flexible electronics device substrate and a flexible electronics device that contain the oriented polyester film.

The oriented polyester film of the invention exhibits small thermal shrinkage at a high temperature, and in addition, has excellent dimensional stability with a small coefficient of linear thermal expansion to temperature change in a working temperature range, and therefore, the oriented polyester film is favorably used as a flexible electronics device substrate.

BRIEF DESCRIPTION OF THE DRAWING

In FIG. 1, symbols denote the following.
1 Pattern width
2 Interline space
3 Pattern length
4 Direct current power source

Figure 1:
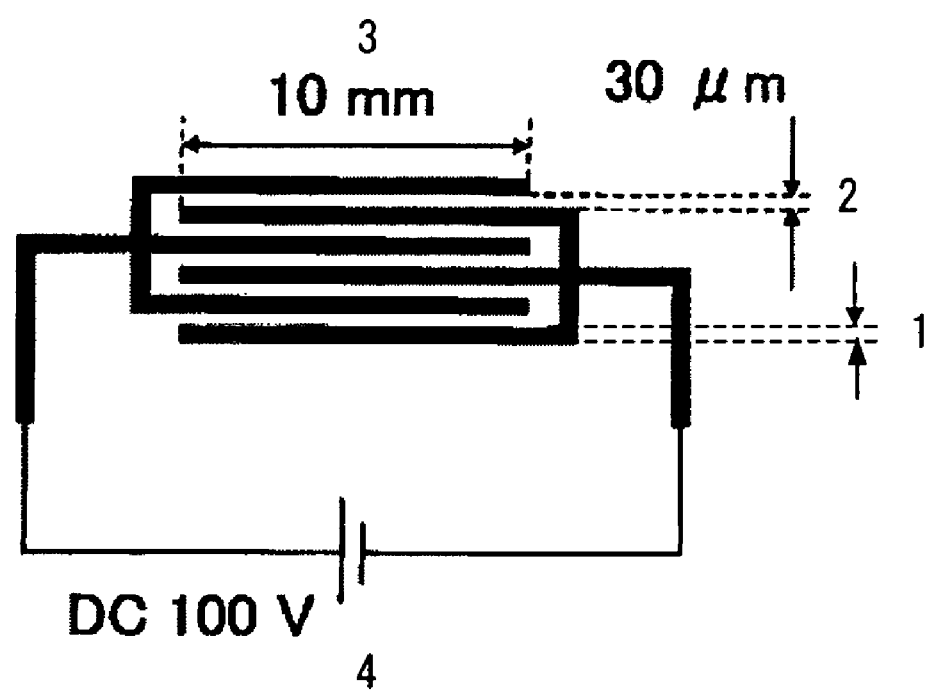
FIG. 1 is a diagram exemplarily showing a circuit pattern used in evaluation of electric insulating property in the invention.

BEST MODE FOR CARRYING OUT THE INVENTION (Polyester)

The substrate layer of the oriented polyester film of the invention contains as a major component polyethylene-2,6-naphthalene dicarboxylate. The polyethylene-2,6-naphthalene dicarboxylate contains 2,6-dinaphthalene carboxylic acid as a major dicarboxylic acid component and ethylene glycol as a major glycol component. The term "major" used herein means at least 90% by mol, and preferably at least 95% by mol, based on the total molar number of the repeating structural units based on the polymer constituting the substrate layer of the oriented film of the invention.

The polyethylene-2,6-naphthalene dicarboxylate in the invention may be used solely or may be a copolymer with another polyester or a mixture of plural kinds of polyesters. The other components in the copolymer or the mixture is preferably contained in an amount of 10% by mol or less, and more preferably 5% by mol or less, based on the total molar number of the repeating structural units. In the case of the copolymer, the copolymerization component constituting the copolymer may be a compound having two ester forming functional groups, preferred examples of which include a dicarboxylic acid, such as oxalic acid, adipic acid, phthalic acid, sebacic acid, dodecanedicarboxylic acid, isophthalic acid, terephthalic acid, 1,4-cyclohexanedicarboxylic acid, 4,4'-diphenyldicarboxylic acid, phenylindanedicarboxylic acid, 2,7-naphthalenedicarboxylic acid, tetralindicarboxylic acid, decalindicarboxylic acid and diphenyletherdicarboxylic acid, an oxycarboxylic acid, such as p-oxybenzoic acid and p-oxyethoxybenzoic acid, and a dihydric alcohol, such as trimethylene glycol, tetramethylene glycol, hexamethylene glycol, cyclohexanemethylene glycol, neopentyl glycol, an ethylene oxide adduct of bisphenol sulfone, an ethylene oxide adduct of bisphenol A, diethylene glycol and polyethylene oxide glycol.

These compounds may be used solely or in combination of plural kinds thereof. Preferred examples of the acid component among these include isophthalic acid, terephthalic acid, 4,4'-diphenyldicarboxylic acid, 2,7-naphthalenedicarboxylic acid and p-oxybenzoic acid, and preferred examples of the glycol component include trimethylene glycol, hexamethylene glycol, neopentyl glycol and an ethylene oxide adduct of bisphenol sulfone.

The polyethylene-2,6-naphthalene dicarboxylate in the invention may be such a compound that a part of or the entire terminal hydroxyl groups and/or carboxyl groups are blocked with a monofunctional compound, such as benzoic acid and methoxypolyalkylene glycol, or a compound obtained by copolymerizing within such a range a substantially linear polymer is obtained with a slight amount of a trifunctional ester forming compound, such as glycerin and pentaerythritol.

The polyethylene-2,6-naphthalene dicarboxylate in the invention can be obtained by a known method, such as a method of obtaining a polyester having a low polymerization degree directly by reaction of a dicarboxylic acid and a glycol, and a method of reacting a lower alkyl ester of a dicarboxylic acid with a glycol by using, for example, one or plural kinds of compounds containing sodium, potassium, magnesium, calcium, zinc, strontium, titanium, zirconium, manganese or cobalt as a known ester exchange catalyst, and then effecting polymerization reaction in the presence of a polymerization catalyst. Examples of the polymerization catalyst used include an antimony compound represented by antimony trioxide and antimony pentoxide, a germanium compound represented by germanium dioxide, and a titanium compound, such as tetraethyl titanate, tetrapropyl titanate, tetraphenyl titanate, a partially hydrolyzed product of these compounds, ammonium titanyl oxalate, potassium titanyl oxalate and titanium trisacetylacetonate.

In the case where the polymerization is carried out through ester exchange reaction, a phosphorous compound, such as trimethylphosphate, triethylphosphate, tri-n-butylphosphate and orthophosphoric acid, is generally added for the purpose of deactivating the ester exchange catalyst before the polymerization reaction. The preferred content of the phosphorous compound is from 20 to 100 ppm by weight in terms of phosphorous element in the polyethylene-2,6-naphthalene dicarboxylate. In the case where the content of the phosphorous compound is less than 20 ppm, the ester exchange catalyst is not completely deactivated to deteriorate the thermal stability, and the mechanical strength is lowered in some cases. In the case where the content of the phosphorous compound exceeds 100 ppm, the thermal stability is deteriorated, and the mechanical strength is lowered in some cases.

The polyester may be formed into chips after melt polymerization, and then further subjected to solid phase polymerization under heating and reduced pressure or in an inert gas stream, such as nitrogen.

The intrinsic viscosity of the polyethylene-2,6-naphthalene dicarboxylate in the invention is preferably 0.40 dL/g or more, and more preferably from 0.40 to 0.90 dL/g, in o-chlorophenol at 35° C. In the case where the intrinsic viscosity is less than 0.40 dL/g, process breakage might frequently occur. In the case where the intrinsic viscosity exceeds 0.9 dL/g, melt extrusion becomes difficult due to the high melt viscosity, and it is uneconomical due to the prolonged polymerization time.

The polyethylene-2,6-naphthalene dicarboxylate in the invention may contain a colorant, an antistatic agent, an antioxidant, an organic lubricant and a catalyst in such a range that does not impair the advantages of the invention.

(Oriented Polyester Film)

The oriented polyester film of the invention is such an oriented polyester film that contains the aforementioned polyethylene-2,6-naphthalene dicarboxylate as a major component of the substrate layer and is stretched at least in one direction. The oriented polyester film of the invention is preferably a biaxially oriented polyester film stretched in biaxial directions. The oriented polyester film of the invention preferably has a coated layer at least on one surface of the substrate layer film containing the polyethylene-2,6-naphthalene dicarboxylate. In the oriented polyester film of the invention, the substrate layer containing the polyethylene-2,6-naphthalene dicarboxylate preferably contains substantially no inert particle for obtaining transparency and high surface flatness.

(Coefficient of Linear Thermal Expansion)

It is necessary that the oriented polyester film of the invention has a coefficient of linear thermal expansion $\alpha t$ at a temperature of from 30 to 100° C. of from 0 to 15 ppm/° C. in both the longitudinal direction and the width direction of the film. The coefficient of linear thermal expansion in the invention is a value obtained in the following manner. By using a thermomechanical analyzer (TMA), a sample is subjected to a pretreatment under a temperature condition of 100° C. for 30 minutes in a state where a load of 140 g/mm$^2$ is applied with a chuck distance of 15 mm. Subsequently, after lowering the temperature to room temperature, measurement is carried out with a temperature increasing from 30° C. to 100° C. at a rate of 20° C. per minute, and then the coefficient of linear thermal expansion is calculated according to the following equation (1):

$$\alpha t = [\{(L_2 - L_1)\} \times 10^6]]/(L_1 \times \Delta T)] \quad (1)$$

(In the equation, $L_1$ represents the sample length (mm) at the temperature is 30° C., $L_2$ represents the sample length (mm) at the temperature is 100° C., and $\Delta T$ represents the temperature difference between 30° C. and 100° C., i.e., 70° C.)

The upper limit of the coefficient of linear thermal expansion in the invention is preferably 10 ppm/° C. or less, and more preferably 5 ppm/° C. or less. The lower limit of the coefficient of linear thermal expansion in the invention is preferably 1 ppm/° C. or more, and more preferably 2 ppm/° C. or more. In the invention, unless otherwise noted, the longitudinal direction is the conveying direction where the film is continuously formed, and may also be referred to as a film forming direction, a lengthwise direction, a continuous film forming direction or MD of the film. In the invention, the width direction is the direction perpendicular to the longitudinal direction within the film plane, and may also be referred to as a transverse direction or TD. The longitudinal direction and the width direction in the invention can also be defined by the orientation axis. The direction where the major orientation axis is observed is designated as the longitudinal direction, and the direction perpendicular to the major orientation axis is designated as the width direction. The major orientation axis herein is such a direction which has the highest orientation among all the directions within the film plane, and generally agrees with the film forming direction of the film. However, in the case where the stretching ratio in the direction perpendicular to the continuous film forming direction is high, the direction perpendicular to the continuous film forming direction may be the major orientation axis in some cases. The major orientation axis can be obtained by measuring the distribution of refractive index within the film plane, and designating the direction with the highest refractive index as the major orientation axis.

In the case where the coefficient of linear thermal expansion exceeds the upper limit, the dimensional distortion caused by the coefficients of linear thermal expansion of the oriented polyester film and the functional layer laminated thereon is increased, whereby upon laminating the functional layer to the film or after laminating the functional layer thereto, the laminated product suffers cracks or contrary wrinkles, which bring about breakage of the laminated product, and thus it fails to exert sufficiently the intended functions. In the case where the coefficient of linear thermal expansion less than the lower limit, the dimensional distortion caused by the coefficients of linear thermal expansion of the oriented polyester film and the functional layer laminated thereon is increased, whereby upon laminating the functional layer to the film or after laminating the functional layer thereto, the laminated product suffers cracks or contrary wrinkles, which bring about breakage of the laminated product, and thus it fails to exert sufficiently the intended functions.

In order to attain the aforementioned coefficient of linear thermal expansion, the stretching ratio is preferably in a range of from 3.5 to 5.0 times in both MD and TD. The stretching temperature thereon is preferably from 120 to 150° C. The thermal fixing temperature is preferably more than 180° C. and 230° C. or less. A thermal relaxing treatment is preferably carried out for reducing the thermal shrinkage rate, and is preferably carried out at a temperature of from 120 to 160° C.

The biaxially oriented polyester film of the invention is characterized by having such dimensional stability that has not been attained by the conventional products owing to the coefficient of linear thermal expansion and the thermal shrinkage rate at 100° C. within the particular ranges. This is because in general, the molecular orientation is preferably large for decreasing the coefficient of linear thermal expansion, but the thermal shrinkage rate is increased by increasing the molecular orientation. In order to obtain the film of the invention, the balance between the stretching ratio and the thermal fixing temperature is significantly important. In the case where at least one of the stretching ratio and the thermal fixing temperature is outside the range, the balance is disrupted to cause a small thermal shrinkage rate with a large coefficient of linear thermal expansion, and vice versa. In particular, in order to obtain a property of a coefficient of linear thermal expansion of 15 ppm/° C. or less with a thermal shrinkage rate at 100° C. for 10 minutes of 0.1% or less, the following methods are preferred, i.e., (i) a method of stretching at a stretching ratio in a range of from 4.0 to 5.0 times, and subjecting to thermal fixing at a thermal fixing temperature of from 210 to 230° C., or (ii) a method of stretching at a stretching ratio in a range of from 3.5 to 5.0 times, subjecting to thermal fixing at a thermal fixing temperature of more than 180° C. and 230° C. or less, and subjecting to a thermal relaxing treatment at a temperature range of from 120 to 160° C. A property of a coefficient of linear thermal expansion of 15 ppm/° C. or less with a thermal shrinkage rate at 100° C. for 10 minutes of 0.05% or less can be obtained by using the method (ii) among these methods. In the case where the thermal relaxing treatment is carried out at a thermal relaxing temperature exceeding the upper limit, the orientation of the film is relaxed to increase the coefficient of linear thermal expansion in some cases.

(Thermal Shrinkage Rate)

The oriented polyester film of the invention has a thermal shrinkage rate at 100° C. for 10 minutes of 0.5% or less in both the longitudinal direction and the width direction of the film. The thermal shrinkage rate in the invention is preferably 0.3% or less, more preferably 0.1% or less, and particularly preferably 0.05% or less. In the case where the thermal shrinkage rate exceeds the upper limit, the dimensional distortion caused by the thermal shrinkage rates of the oriented polyester film and the functional layer laminated thereon is increased, whereby upon laminating the functional layer to the substrate film or after laminating the functional layer thereto, the laminated product suffers cracks or wrinkles, which bring about breakage of the laminated product, and thus it fails to exert sufficiently the intended functions. In the case where the thermal shrinkage rate at 100° C. for 10 minutes is 0.05% or less in both the longitudinal direction and the width direction of the film, the possibility of causing pattern mismatch due to thermal shrinkage can be considerably decreased when a fine patterning process associated with heating is employed, for example, in such a purpose as a display.

The thermal shrinkage rate in the invention is preferably as small as possible within the aforementioned range, and preferably exceeds −0.1%, and more preferably exceeds 0.

In order to attain the aforementioned thermal shrinkage rate, the stretching ratio is preferably in a range of from 3.5 to 5.0 times in both the longitudinal direction and the width direction since the stretching ratio is preferably as low as possible, but the coefficient of linear thermal expansion is increased thereby. The stretching temperature is preferably from 120 to 150° C. The thermal fixing temperature is preferably more than 180° C. and 230° C. or less since the thermal shrinkage rate is improved by making the thermal fixing temperature as high as possible, but when the thermal fixing temperature is too high, the orientation of the film is relaxed to provide such a tendency that the coefficient of linear thermal expansion is increased. The film is preferably subjected to a heat relaxing treatment for the purpose of further decreasing the thermal shrinkage rate, and is preferably carried out at a temperature of from 120 to 160° C.

The oriented polyester film of the invention preferably has a thermal shrinkage rate at 150° C. for 30 minutes of 2.0% or less in both the longitudinal direction and the width direction. In the case where the thermal shrinkage rate at 150° C. for 30 minutes exceeds 2.0%, upon laminating the functional layer to the film or after laminating the functional layer thereto, dimensional change of the oriented polyester film as a substrate is larger than that of the functional layer to cause cracks or wrinkles in the laminated product during the production process including a step at a temperature of more than 100° C. or about 150° C., which bring about in some cases breakage of the laminated product, and thus it might fail to exert sufficiently the intended functions. The thermal shrinkage rate at 150° C. for 30 minutes is more preferably 1.5% or less, and particularly preferably 1.0% or less. The thermal shrinkage rate at 150° C. in the invention is preferably as small as possible within the aforementioned range, and is preferably exceeds −0.3%, and more preferably exceeds 0.

(Film Thickness)

The thickness of the oriented polyester film of the invention is in a range of from 12 to 250 μm. The thickness of the oriented polyester film is preferably from 25 to 200 μm. In the case where the thickness of the film is less than the lower limit, the mechanical strength might not be maintained upon using as a flexible electronics device substrate. Furthermore, the insulating capability and the flexural rigidity of the film might be insufficient. In the case where the thickness of the oriented polyester film exceeds the upper limit, on the other hand, the thinness demanded in the flexible electronics device purpose might not be attained. Furthermore, the film suffers cracks or irreversible breakage upon application of an external force due to the insufficient flexural resistance of the film.

(Total Light Transmittance)

The total light transmittance of the oriented polyester film of the invention is preferably 85% or more. The total light transmittance in the invention is more preferably 87% or more, and particularly preferably 90% or more. In the case where the total light transmittance is less than the lower limit, the film might be deteriorated in transparency to lower the brightness upon applying, for example, to the display purpose. Furthermore, in the case where the film is used as a flexible printed circuit board, it might be difficult to employ such use that the circuit board is illuminated from beneath, for example, with a light emitting diode, and the illumination is viewed above the board. The upper limit thereof is preferably as high as possible within the range of the total light transmittance in the invention, and is preferably less than 100%. The total light transmittance is attained by containing no inert particle in the substrate layer of the biaxially stretched polyester film, and in the case where a coated layer is provided at least one surface of the substrate layer, by adjusting the polymer binder and fine particles in the coated layer.

(Haze)

The haze of the oriented polyester film of the invention is preferably 1.5% or less. The haze in the invention is more preferably 1.0% or less, and particularly preferably 0.5% or less. In the case where the haze exceeds the upper limit, the transparency might be deteriorated to lower the brightness upon applying, for example, to the display purpose. Furthermore, in the case where the film is used as a flexible printed circuit board, it might be difficult to employ such use that the circuit board is illuminated from beneath, for example, with a light emitting diode, and the illumination is viewed above the board. The lower limit thereof is preferably as low as possible within the range of the haze in the invention, and is preferably 0%. The haze is attained by containing no inert particle in the substrate layer of the biaxially stretched polyester film, and in the case where a coated layer is provided at least one surface of the substrate, layer, by adjusting the polymer binder and fine particles in the coated layer.

(Difference in Coefficient of Linear Thermal Expansion)

The oriented polyester film of the invention preferably has an absolute value of a difference between the coefficient of linear thermal expansion in the longitudinal direction ($\alpha t_{MD}$) and the coefficient of linear thermal expansion in the width direction ($\alpha t_{TD}$), i.e., $|\alpha t_{MD} - \alpha t_{TD}|$, of from 0 to 5 ppm/° C. In the case where $|\alpha t_{MD} - \alpha t_{TD}|$ exceeds 5 ppm/° C. in the invention, upon laminating the functional layer to the substrate film or after laminating the functional layer thereto, the laminated product suffers cracks or wrinkles, which bring about breakage of the laminated product, and thus it fails to exert sufficiently the intended functions. In order to satisfy the aforementioned range, the difference in stretching ratio between MD and TD is preferably 0.3 time or less.

(Three-Dimensional Center Line Average Roughness SRa)

The oriented polyester film of the invention preferably has a three-dimensional center line average roughness SRa of from 5 to 20 nm on one surface thereof. In the case where SRa is less than 5 nm, a sufficient lubricity might not be obtained to make winding difficult. In the case where SRa exceeds 20 nm, on the other hand, there is such a possibility that penetration on coating or vapor-depositing occurs upon laminating a functional layer on the film, while excellent lubricity is obtained, and thus the functional layer might not exert the function sufficiently.

The oriented polyester film of the invention preferably has a three-dimensional center line average roughness SRa of from 0 to 5 nm on the other surface, i.e., the opposite surface to the surface having the aforementioned SRa. In the case where SRa on the other surface exceeds 5 nm, there is such a possibility that penetration on coating or vapor-depositing occurs upon laminating a considerably thin functional layer on the film, and thus the functional layer might not exert the function sufficiently. The lower limit of the range of SRa on the other surface is preferably as small as possible, and is preferably 0 nm.

With respect to SRa of the oriented polyester film of the invention, in the case where a coated layer is provided at least one surface of the film, the surface of the coated layer is designated as the surface of the film.

(Ten-Point Average Roughness SRz)

The biaxially stretched polyester film of the invention, in the case where it has a coated layer on at least one surface of the substrate layer, preferably has a ten-point average roughness Rz on the surface of the substrate layer of from 2 to 30 nm. The ten-point average roughness Rz on the surface of the substrate layer is more preferably from 3 to 29 nm, and particularly preferably from 4 to 28 nm. In the case where Rz on the surface of the substrate layer is less than the lower limit, the film is poor in lubricity, and upon winding the film into a roll, transfer or wrinkles might occur due to air intervening between the films, which bring about deterioration in flatness. In the case where Rz exceeds the upper limit, and in the case where the film is used, for example, as a flexible printed circuit board, there may be cases where upon forming a minute circuit having a line/space distance of 25 μm/25 μn or less, a metallic layer in recessed parts in the area to be etched remains without being etched to form minute metallic dusts in an island form, and upon applying thereto a voltage for a long period of time, they cause insulation failure among conductors (migration). Furthermore, there is such a possibility that penetration on coating or vapor-depositing occurs upon laminating a considerably thin functional layer on the film, and thus it might not exert the function sufficiently due to a slight number of defects.

In order to attain the aforementioned surface roughness, the substrate layer containing polyethylene-2,6-naphthalene dicarboxylate preferably does not contain inert particles containing coarse particles having a diameter of 1.0 μm or more, and more preferably does not contain inert particles containing coarse particles having a diameter of 0.50 μm or more.

The surface roughness on the surface of the substrate layer in the invention is more preferably a three-dimensional surface roughness SRa of from 0 to 5 nm and a ten-point average roughness Rz of from 2 to 30 nm. The three-dimensional surface roughness SRa is ascribable to the average particle diameters and the numbers of the coarse particles and the inert particles, and the ten-point average roughness Rz is ascribable to the average particle diameter of the coarse particles.

The biaxially stretched polyester film of the invention, in the case where it has a coated layer on at least one surface of the substrate layer, preferably has a ten-point average roughness Rz on the surface of the coated layer of from 50 to 150 nm. The ten-point average roughness Rz on the surface of the coated layer is more preferably from 60 to 140 nm. In the case where Rz is less than the lower limit, the film might be poor in lubricity to make winding difficult, and the film might suffer partially wrinkles and irregularity to deteriorate the flatness. In the case where Rz exceeds the upper limit, the film might be deteriorated in transparency, and the fine particles in the coated layer might be dropped off, while excellent lubricity is obtained. The surface roughness on the surface of the coated layer in the invention is attained with the average particle diameter and the content of the fine particles in the coated layer.

(Coated Layer)

The oriented polyester film of the invention preferably has a coated layer on at least one surface of the substrate layer containing polyethylene-2,6-naphthalene dicarboxylate. The coated layer preferably contains a polymer binder, fine particles and aliphatic wax.

Since the biaxially stretched polyester film of the invention is preferably good in optical characteristics expressed by the total light transmittance and the haze, the polymer binder and the fine particles contained in the coated layer preferably have substantially the same refractive index. The language, substantially the same refractive index, herein means that the difference in refractive index between them is 0.04 or less. The difference in refractive index between them is more preferably 0.02 or less, further preferably 0.01 or less, and particularly preferably 0.005 or less. In the case where the difference in refractive index exceeds the upper limit, there may be cases where light is strongly scattered at an interface between the polymer binder and the fine particles due to the difference in refractive index, whereby the haze of the coated layer is increased to deteriorate the transparency.

The polymer binder used in the coated layer of the invention is preferably a mixture of a polyester resin and an acrylic resin having an oxazoline group and a polyalkylene oxide chain, from the standpoint of imparting favorable adhesiveness between the coated layer and the respective layers, to which the coated layer is to be adhered. The polymer binder is preferably soluble or dispersible in water, and those capable of being dissolved in water containing a slight amount of an organic solvent may also be preferably used.

The thickness of the dried coated layer in the invention is preferably from 0.01 to 0.2 μm, and more preferably from 0.02 to 0.1 μm.

(Polymer Binder)

Examples of the polyester resin constituting the polymer binder include polyester obtained from polybasic acid components and diol components shown below. Examples of the polybasic acid component include terephthalic acid, isophthalic acid, phthalic acid, phthalic anhydride, 2,6-naphthalenedicarboxylic acid, 1,4-cyclohexanedicarboxylic acid, adipic acid, sebacic acid, trimellitic acid, pyromellitic acid, dimer acid and 5-sodiumsulfoisophthalic acid. The polyester resin constituting the polymer binder is preferably a copolymer polyester using plural kinds of polybasic acid components. The polyester resin may contain a small amount of an unsaturated polybasic acid component, such as maleic acid and itaconic acid, or a hydroxycarboxylic acid component, such as p-hydroxybenzoic acid. Examples of the diol component include ethylene glycol, 1,4-butanediol, diethylene glycol, dipropylene glycol, 1,6-hexanediol, 1,4-cyclohexanedimethanol, xylene glycol, dimethylolpropane, poly(ethylene oxide) glycol and poly(tetramethylene oxide) glycol.

The glass transition temperature of the polyester resin constituting the polymer binder is preferably from 40 to 100° C., and more preferably from 60 to 80° C. In the case where the glass transition temperature is in the range, excellent adhesiveness and excellent scratch resistance can be obtained. In the case where the glass transition temperature is lower than the lower limit, blocking is liable to occur between the films, and in the case where it exceeds the upper limit, the scratch resistance might be deteriorated due to the hard and brittle coated film.

Examples of the acrylic resin having an oxazoline group and a polyalkylene oxide chain used as a constitutional component of the polymer binder include acrylic resins formed from monomers having an oxazoline group and monomers having a polyalkylene oxide chain shown below.

Examples of the monomer having an oxazoline group include 2-vinyl-2-oxazoline, 2-vinyl-4-methyl-2-oxazoline, 2-vinyl-5-methyl-2-oxazoline, 2-isopropenyl-2-oxazoline, 2-isopropenyl-4-methyl-2-oxazoline and 2-isopropenyl-5-methyl-2-oxazoline. These may be used solely or as a mixture of plural kinds thereof. Among these, 2-isopropenyl-2-oxazoline is easily available industrially and is preferably used. The use of the acrylic resin having an oxazoline group improves the cohesive force of the coated layer, whereby the adhesiveness to the adjacent layer, such as a hardcoat and a sticky layer, is strengthened. Furthermore, scratch resistance to a metallic roll, which is used in the film forming process and the working process of a hardcoat, can be imparted.

Examples of the monomer having a polyalkylene oxide chain include monomers obtained by adding polyalkylene oxide to an ester bond part of acrylic acid and methacrylic acid. Examples of the polyalkylene oxide chain include polymethylene oxide, polyethylene oxide, polypropylene oxide and polybutylene oxide. The number of repeating units of the polyalkylene oxide chain is preferably from 3 to 100. The use of the acrylic resin having a polyalkylene oxide chain improves the compatibility between the polyester resin and the acrylic resin in the coated layer as compared to the case of an acrylic resin containing no polyalkylene oxide chain, whereby the transparency of the coated layer can be improved. In the case where the number of repeating units of the polyalkylene oxide chain is less than 3, only poor compatibility between the polyester resin and the acrylic resin is obtained to deteriorate the transparency of the coated layer, and in the case where it exceeds 100, the humidity and heat resistance of the coated layer is deteriorated, whereby the adhesiveness to the adjacent layer might be deteriorated under a high humidity and high temperature condition.

The acrylic resin may be copolymerized, for example, with monomers shown below as other copolymerization components. Examples of the copolymerization component include alkyl acrylate and alkyl methacrylate (wherein examples of the alkyl group include a methyl group, an ethyl group, a n-propyl group, an isopropyl group, a n-butyl group, an isobutyl group, a t-butyl group, a 2-ethylhexyl group and a cyclohexyl group); a hydroxyl group-containing monomer, such as 2-hydroxyethylmethacrylate, 2-hydroxypropyl acrylate and 2-hydroxypropyl methacrylate; an epoxy group-containing monomer, such as glycidyl acrylate, glycidyl methacrylate and allyl glycidyl ether; a monomer having a carboxylic acid or a salt thereof, such as acrylic acid, methacrylic acid, itaconic acid, maleic acid, fumaric acid, crotonic acid, styrenesulfonic acid, and salts thereof (such as a sodium salt, a potassium salt, an ammonium salt and a tertiary amine salt); a monomer having an amide group, such as acrylamide, methacrylamide, N-alkylacrylamide, N-alkylmethacrylamide, N,N-dialkylacrylamide and N,N-dialkylmethacrylamide (wherein examples of the alkyl group include a methyl group, an ethyl group, a n-propyl group, an isopropyl group, a n-butyl group, an isobutyl group, a t-butyl group, a 2-ethylhexyl group and a cyclohexyl group), N-alkoxyacrylamide, N-alkoxymethacrylamide, N,N-dialkoxyacrylamide and N,N-dialkoxymethacrylamide (wherein examples of the alkoxy group include a methoxy group, an ethoxy group, a butoxy group and an isobutoxy group), acryloylmorpholine, N-methylolacrylamide, N-methylolmethacrylamide, N-phenylacrylamide and N-phenylmethacrylamide; a monomer of an acid anhydride, such as maleic anhydride and itaconic anhydride; vinyl isocyanate, allyl isocyanate, styrene, α-methylstyrene, vinylmethylether, vinyl ethyl ether, vinyltrialkoxysilane, alkylmaleic acid monoester, alkylfumaric acid monoester, alkylitaconic acid monoester, acrylonitrile, methacrylonitrile, vinylidene chloride, ethylene, propylene, vinyl chloride, vinyl acetate, and butadiene.

The content of the polyester resin constituting the coated layer is preferably from 5 to 95% by weight, and particularly preferably from 50 to 90% by weight, based on the weight of the polymer binder. The content of the acrylic resin having an oxazoline group and a polyalkylene oxide chain is preferably from 5 to 95% by weight, and particularly preferably from 10 to 50% by weight, based on the weight of the polymer binder. In the case where the content of the polyester resin exceeds 95% by weight or the content of the acrylic resin having an oxazoline group and a polyalkylene oxide chain is less than 5% by weight, the cohesive force of the coated layer might be lowered to make insufficient the adhesiveness to the adjacent layer, such as a hardcoat and a sticky agent. In the case where the content of the acrylic resin exceeds 95% by weight or the content of the polyester resin is less than 5% by weight, the adhesiveness to the polyester film might be lowered, and the adhesiveness to the adjacent layer might be insufficient.

The content of the polymer binder is preferably from 40 to 99.4% by weight based on the weight of the coated layer. In the case where it is less than 40% by weight, the cohesive force of the coated layer might be lowered to make insufficient the adhesiveness to the polyester film, a hardcoat, a sticky agent or the like, and in the case where it exceeds 99.4% by weight, there may be cases where sufficient lubricity and sufficient scratch resistance cannot be obtained.

The refractive index of the polymer binder in the invention is generally in a range of from 1.50 to 1.60.

(Fine Particles)

Preferred examples of the fine particles constituting the coated layer in the invention include composite inorganic fine particles of silica and titania. The composite inorganic particles of silica and titania can be arbitrarily controlled in refractive index, and therefore, the refractive indices of the polymer binder and the fine particles can be easily adapted to each other. The refractive index of the polymer binder is preferably in a range of from 1.50 to 1.60, and the refractive index of the fine particles is also preferably in a range of from 1.50 to 1.60 as similar to the polymer binder.

The average particle diameter of the fine particles is preferably in a range of from 40 to 120 nm. In the case where the average particle diameter exceeds 120 nm, the particles are liable to be dropped off, and the surface roughness of the film might exceed the intended range. In the case where the average particle diameter of the fine particles is less than 40 nm, there may be cases where sufficient lubricity and sufficient scratch resistance cannot be obtained. The content of the fine particles is preferably in a range of from 0.1 to 10% by weight based on the weight of the coated layer. In the case where it is less than 0.1% by weight, there may be cases where sufficient lubricity and sufficient scratch resistance cannot be obtained, and in the case where it exceeds 10% by weight, the cohesive force of the coated layer might be deteriorated to deteriorate the adhesiveness, and the surface roughness of the film might exceed the intended range.

(Aliphatic Wax)

The coated layer of the invention preferably contains aliphatic wax for the purpose of obtaining lubricity on the surface of the film. The content of the aliphatic wax is preferably from 0.5 to 30% by weight, and more preferably from 1 to 10% by weight, based on the weight of the coated layer. In the case where the content of the aliphatic wax is less than the lower limit, sufficient lubricity might not be obtained on the surface of the film. In the case where the content of the aliphatic wax exceeds the upper limit, the adhesiveness to the substrate layer of the polyester film and the easy adhesion property to the adjacent layer, such as a hardcoat and a sticky agent, might be insufficient. Specific examples of the aliphatic wax include vegetable wax, such as carnauba wax and candelilla wax, animal wax, such as bees wax and lanolin, mineral wax; such as montan wax, ozokerite and ceresin wax, petroleum wax, such as paraffin wax, microcrystalline wax and petrolatum, and synthesized hydrocarbon wax, such as Fischer-Tropsch wax, polyethylene wax, oxidized polyethylene wax, polypropylene wax and oxidized polypropylene wax. Among these, carnauba wax, paraffin wax and polyethylene wax are particularly preferred since they are good in easy adhesion property to a hardcoat and a sticky agent, and lubricity. The wax is preferably used in the form of an aqueous dispersion since the environmental load can be reduced, and it can be easily handled.

(Other Additives)

The coated layer may contain other fine particles for further improving the lubricity and the scratching resistance in such a range that does not impair the transparency. Examples of the other fine particles include inorganic fine particles, such as calcium carbonate, magnesium carbonate calcium oxide, zinc oxide, magnesium oxide, silicon oxide, sodium silicate, aluminum oxide, iron oxide, zirconium oxide, barium sulfate, titanium oxide, tin oxide, antimony trioxide, carbon black and molybdenum disulfide, and organic fine particles, such as an acrylic crosslinked polymer, a styrene crosslinked polymer, a silicone resin, a fluorine resin, a benzoguanamine resin, a phenol resin and a nylon resin. As for a solid substance that is insoluble water among these, fine particles having a specific gravity that does not exceed 3 are preferably selected to prevent them from being precipitated in an aqueous dispersion.

(Film Forming Method)

The oriented polyester film of the invention can be obtained in such a manner that polyethylene-2,6-naphthalene dicarboxylate mentioned above is melt-extruded into a film form and cooled and solidified with a casting drum to form an unstretched film, and the unstretched film is biaxially stretched at a stretching temperature of from Tg to (Tg+30), and preferably from 120 to 150° C., to a ratio of from 3.5 to 5.0 times in each of the longitudinal direction and the width direction, and then thermally fixed at a temperature of from (Tm-100) to (Tm-5), and preferably more than 180° C. and 230° C. or less, for 1 to 100 second, so as to obtain a desired film. The thermal fixing improves the dimensional stability of the resulting film in a high temperature condition. The oriented polyester film of the invention can be obtained by setting the stretching ratio and the thermal fixing temperature upon forming the film into the prescribed ranges, as having been described for the coefficient of linear thermal expansion and the thermal shrinkage rate.

The stretching operation may be carried out by a method ordinarily employed, such as a method using a roll and a method using a tenter. The stretching operations may be carried out simultaneously in the longitudinal direction and the width direction, and may be carried out sequentially in the longitudinal direction and the width direction. In the case of the sequential stretching operation, the coated layer is formed by coating an aqueous coating composition on a uniaxially stretched film having been stretched in one direction, and stretching the film in the other direction, followed by subjecting to thermal fixing. Examples of the coating method include a roll coating method, a gravure coating method, a roll brush coating method, a spray coating method, an air knife coating method, a dip coating method and a curtain coating method, which may be used solely or in combination. The symbol Tg represents the glass transition temperature of the polymer, and Tm represents the melting point of the polymer.

In order to obtain a coefficient of linear thermal expansion of 15 ppm/° C. or less and a thermal shrinkage rate at 100° C. for 10 minutes of 0.1% or less, one of the following methods is preferred, i.e., (i) a method of stretching at a stretching ratio in a range of from 4.0 to 5.0 times, and subjecting to thermal fixing at a thermal fixing temperature of from 210 to 230° C., or (ii) a method of stretching at a stretching ratio in a range of from 3.5 to 5.0 times, subjecting to thermal fixing at a thermal fixing temperature of more than 180° C. and 230° C. or less, and subjecting to a thermal relaxing treatment at a temperature range of from 120 to 160° C. A property of a coefficient of linear thermal expansion of 15 ppm/° C. or less with a thermal shrinkage rate at 100° C. for 10 minutes of 0.05% or less can be obtained by using the method (ii) among these methods.

Examples of the method of thermal relaxing include a method of separating off both ends of the film in the course of the thermal fixing zone during the period until the film is wound into a roll after the thermal fixing, and decreasing the drawing speed of the film as compared to the feeding speed of the film, a method of heating the film with an IR heater between two conveying rolls having different speeds, a method of conveying the film on a heating conveying roll, and decreasing a speed of a conveying roll after the heating conveying roll, a method of conveying the film on a nozzle, from which hot air is blown, after the thermal fixing, and decreasing the drawing speed as compared to the feeding speed, a method of conveying the film on a heating conveying roll, and decreasing a speed of a conveying roll, and a method of conveying the film in a heating zone, such as a heating oven or an IR heater, and decreasing a roll speed after the heating zone as compared to a roll speed before the heating zone, and any method may be used. In this case, it is preferred that the relaxing treatment is carried out by decreasing the speed on the drawing side by from 0.1 to 10% as compared to the speed of the feeding side.

(Hardcoat Layer or Sticky Agent Layer)

In the case where the oriented polyester film of the invention has a coated layer at least one surface of the substrate layer containing polyethylene-2,6-naphthalene dicarboxylate, such an oriented polyester film can be exemplified as a preferred embodiment that has a hardcoat layer or a sticky agent layer on the coated layer. The hardcoat layer or the sticky agent layer is preferably formed on the coated layer.

The hardcoat layer is not particularly limited as far as it is a curable resin that is high in chemical resistance and scratch resistance. Examples of the curable resin include an ionizing radiation curable resin and a thermosetting resin, and an ionizing radiation curable resin is preferred since the film forming operation thereof on the oriented polyester film is easily carried out, and the pencil hardness can be improved to a desired value. The use of the resin as the hardcoat layer provides such a hardcoat layer that is excellent in transparency and surface protective property, and is excellent in adhesiveness to the coated layer.

The sticky agent layer is demanded to have releasability with no sticky agent remaining after releasing, and to cause no releasing or bubble in an accelerated aging test at a high temperature and a high humidity. Examples of the sticky agent having the properties include an acrylic series, a rubber series, a polyvinyl ether series and a silicone series, which may be appropriately selected and used. An acrylic sticky agent is particularly preferred. The use of an acrylic resin as the sticky agent layer can provide an appropriate releasing property.

(Flexible Electronics Device Substrate)

The orietend polyester film of the invention can be favorably used as a flexible electronics device substrate. In the case where the oriented polyester film of the invention having the prescribed coefficient of linear thermal expansion and thermal shrinkage characteristics as a flexible electronics device substrate, the functional layers can exert sufficiently the functionality thereof owing to the excellent dimensional stability not only at a high temperature but also in a working temperature range. Specific examples of the flexible electronics device substrate include substrates of flexible electronics devices, such as a liquid crystal display, an organic EL display, electronics paper, a dye sensitized solar cell and a flexible printed circuit.

In the case where the oriented polyester film of the invention is used as a supporting substrate, for example, of a liquid crystal display and an organic EL display, visibility, which is required in these image display devices, can be provided owing to the transparency thereof.

The flexible electronics device substrate of the invention causes no defect in a functional layer laminated on the substrate since the surface flatness of the oriented polyester film of the invention is in the desired range, and therefore, good gas barrier property, for example, to oxygen and water vapor can be provided.

In the case where the flexible electronics device substrate of the invention is used as a flexible printed circuit board, it preferably has such a constitution that a copper foil or a conductive paste is laminated on the surface of the oriented polyester film of the invention. The flexible printed circuit board preferably has a minute circuit pattern having a line/space distance of 25 µm/25 µm or less formed thereon, and more preferably has a minute circuit pattern having a line/space distance of 20 µm/20 µm or less formed thereon. The flexible printed circuit board of the invention preferably has the minute circuit pattern formed thereon, and preferably has an insulating resistance value of the flexible printed circuit board, to which a direct current voltage (DC) of 100 V is continuously applied in an environment of 85° C. and 85% RH, satisfying the following equation (I). In the case where $R_{1000}/R_0$ is less than 0.7, there may be some cases where the circuit is insufficient in long-term electric characteristics, and cannot be used as a flexible printed circuit board required to have insulating characteristics for a long period of time.

$$R_{1000}/R_0 \geq 0.7 \quad \text{(I)}$$

(In the equation, $R_{1000}$ represents an insulating resistance value (unit: MΩ) after continuously applying DC 100 V for 1,000 hours, and $R_0$ represents the initial insulating resistance value (unit: MΩ).)

In order to attain $R_{1000}/R_0$ within the range in the invention, the ten-point surface roughness Rz on the surface of the substrate layer of the oriented polyester film is preferably in the range in the invention. Even in the case where a minute circuit having a line/space distance of 25 µm/25 µm or less is formed, since the surface of the substrate layer is considerably flat, etching of the laminated metallic layer is continuously formed owing to the considerably small irregularity on the surface of the film, and thus, an etching defect causing insulation failure among conductors (migration), i.e., metallic dusts remaining not etched, is not formed.

(Flexible Electronics Device)

Examples of the flexible electronics device of the invention include a flexible electronics device containing such a structure that has the flexible electronics device substrate of the invention having laminated thereon at least one layer selected from the group consisting of a gas barrier layer, a conductor layer, a semiconductor layer and a luminescent layer. Specific examples of the flexible electronics device include a liquid crystal display, an organic EL display, electronics paper, a dye sensitized solar cell and a flexible printed circuit. The gas barrier layer, the conductor layer, the semiconductor layer and the luminescent layer are not particularly limited as far as they exert the functionality thereof.

Examples of the organic EL display among the flexible electronics devices include an organic EL display containing such a structure that has the oriented polyester film having laminated thereon a coated layer, a primer layer, a gas barrier layer and a conductor layer, and a hardcoat layer may be further laminated thereon depending on necessity.

Examples of the flexible printed circuit include a flexible printed circuit containing such a structure that has the oriented polyester film having formed on one surface of the substrate layer a coated layer, and having laminated on the other surface of the substrate layer opposite to the coated layer a metallic layer as a conductor layer. Examples of the metallic Layer include a metallic foil, such as a copper foil and an aluminum foil, and a conductive paste. The metallic foil can be obtained by the ordinary method, such as one obtained by rolling and one obtained by electrolysis. The conductive paste is a resin ink having a high viscosity having mixed therein conductive fine powder, such as silver, copper or carbon, to impart conductivity. Among the metallic foils and the conductive paste, a copper foil is preferred, and the productivity in the step of producing the flexible printed circuit board can be improved by using a copper-clad laminated plate obtained by laminating a copper foil on the biaxially stretched polyester film.

The thickness of the metallic foil is preferably from 5 to 100 μm. Examples of the method of laminating the metallic foil include a method of using an adhesive agent, and a method of directly adhering by melting the surface layer of the substrate layer of the polyester film. The adhesive may not be specified herein, and a thermosetting resin is preferred from the standpoint of heat resistance. Preferred examples of the thermosetting resin include an epoxy resin, a phenol resin, an acrylic resin, a polyimide resin, a polyamide resin, a polyisocyanate resin, a polyester resin, a polyphenyl ether resin and an alicyclic olefin polymer. Other components may be added to the adhesive depending on necessity. Examples of the additive include an ultraviolet ray absorbent, a flexible polymer, a filler, a heat stabilizer, a weather stabilizer, an antiaging agent, a leveling agent, an antistatic agent, a slipping agent, an antiblocking agent, an antifogging agent, a dye, a pigment, a natural oil, a synthetic oil, wax, an emulsion, an infilling, a hardening agent and a flame retardant. The mixing ratios thereof may be appropriately selected within a range where the advantages of the invention are not impaired. The method of laminating a metallic foil in the invention may be such a method that a metallic foil is formed directly on the film by plating or sputtering without the use of an adhesive.

EXAMPLES

The invention will be described with reference to examples below. The characteristic values and the evaluation methods are measured and evaluated in the following manners. The parts and percents in the examples are parts by weight and percents by weight, respectively, unless otherwise indicated.

(1) Film Thickness

The film thickness was measured at ten points by using an electronic micrometer (Model K-312A, a trade name, produced by Anritsu Corp.) at a stylus pressure of 30 g, and an average value was designated as the film thickness.

(2) Melting Point and Glass Transition Temperature 10 mg of the sample was sealed in an aluminum pan for measurement and set in a differential calorimeter (DSC2920, a trade name, produced by TA Instruments). The temperature was increased from 25° C. to 300° C. at a rate of 20° C. per minute, and after maintaining at 300° C. for 5 minutes, the pan was taken out and then quenched by placing on ice. The pan was again set in the differential calorimeter, and the temperature was increased from room temperature at a rate of 10° C. per minute to measure the glass transition temperature (Tg (° C.)) and the melting point (Tm (° C.))

(3) Coefficient of Linear Thermal Expansion αt

The film sample was cut into a length of 20 mm and a width of 5 mm in the longitudinal direction (continuous film forming direction) and the width direction (direction perpendicular to the film forming direction), respectively, and then pretreated under a temperature condition of 100° C. for 30 minutes in a state where a load of 140 g/mm² was applied with a chuck distance of 15 mm using TMA/SS120C manufactured by Seiko Instruments Inc., followed by lowering the temperature to room temperature. Thereafter, the temperature was increased from 30° C. to 100° C. at a rate of 20° C. per minute to measure the dimensional changes in both the directions, and the dimensional change rate was calculated by the following equation (1):

$$\alpha t = [\{(L_2 - L_1) \times 10^6\}/(L_1 \times \Delta T)] \tag{1}$$

In the equation,
$L_1$: sample length (mm) at 30° C.,
$L_2$: sample length (mm) at 100° C., and
$\Delta T$: 70=(100° C.−30° C.)

The absolute value of the difference between the coefficient of linear thermal expansion in the longitudinal direction ($\alpha t_{MD}$) and the coefficient of linear thermal expansion in the width direction ($\alpha t_{TD}$) of the film was calculated from the coefficients of linear thermal expansion obtained above.

(4) Thermal Shrinkage Rate

The film sample having gauge marks placed with an interval of 30 cm was subjected to a heat treatment in an oven at a prescribed temperature for a prescribed period of time without application of a load. Distances of the gauge marks after the heat treatment were measured, and the thermal shrinkage rates were calculated by the following equation in the film longitudinal direction (continuous film forming direction) and the width direction (direction perpendicular to the film forming direction).

Thermal shrinkage rate (%)=((Gauge mark distance before heat treatment−Gauge mark distance after heat treatment)/Gauge mark distance before heat treatment)×100

(5) Haze and Total Light Transmittance

A total light transmittance Tt (%) and a scattered light transmittance Td (%) were obtained according to JIS K6714 (1958), and a haze ((Td/Tt)×100) (%) was calculated.

(6) Surface Roughness (Three-Dimensional Center Line Roughness SRa)

A three-dimensional center line average roughness SRa as a surface roughness was measured by using a non-contact three-dimensional roughness meter (ET30HK, a trade name, produced by Kosaka Laboratory Ltd.) under the following conditions.

Semiconductor laser with wavelength of 780 nm
Measured length: 1 mm

Sampling pitch: 2 μm
Cutoff: 0.25 mm
Magnification in longitudinal direction (continuous film forming direction): 100,000
Magnification in width direction (direction perpendicular to the film forming direction): 200
Number of scanning lines: 100

(7) Surface Roughness (Ten-point Average Roughness Rz)

Rz calculated under the following conditions was measured by using an atomic force microscope (J Scanner of Nano Scope III AFM, a trade name, produced by Digital Instruments).
Probe: single bond silicon sensor
Scanning mode: tapping mode
Number of pixels: 256×256 data points
Scanning speed: 2.0 Hz
Measurement environment: room temperature in the air
Scanning range: 10 μm×10 μm (8) Water Absorption Rate A water absorption rate was measured according to JIS K7209.

(9) Gas Barrier Property

An acrylic resin was coated to 2 μm as a primer layer on the surface of the coated layer of the film sample, and an $SiO_2$ layer having a thickness of 30 nm as a gas barrier layer was formed thereon by a sputtering method, followed by subjecting to a heat treatment at 100° C. for 1 hour. After allowing to stand at room temperature, a water vapor transmittance in an environment of 40° C. and 90% RH was measured by using Permatran W1A, produced by Mocon, Inc., and evaluated by the following standard.
AA: less than 0.05 g/m²·day
A: 0.05 g/m²·day or more and less than 0.1 g/m²·day
B: 0.1 g/m²·day or more and less than 0.5 g/m²·day
C, 0.5 g/m²·day or more

(10) Electric Insulating Property

A copper foil was laminated on the surface of the substrate layer of the film sample, and a circuit pattern having an interdigitated pattern having a pattern length 3 of 10 mm as shown in FIG. 1 was formed by etching. The sample was placed in a constant-temperature and constant-humidity chamber at 85° C. and 85% RH and was allowed to stand therein for 24 hours. Thereafter, the sample was applied with a voltage of DC 100 V, continuously applied with DC 100 V in the same environment, and the resistance value was continuously monitored. The value $R_{1000}/R_0$, where $R_0$ represents the initial insulating resistance value (unit: MΩ), and $R_{1000}$ represents an insulating resistance value (unit: MΩ) after 1,000 hours, was calculated and evaluated by the following standard. The measurement was carried out with a pattern width 1 and a line width 2 respectively shown in FIG. 1 of 25 μm.
A: $R_{1000}/R_0$ of 0.7 or more
B: $R_{1000}/R_0$ of 0.5 or more and less than 0.7
C: $R_{1000}/R_0$ of less than 0.5

(11) Film Flatness

The film sample and a general purpose vinyl chloride resin were adhered with an adhesive containing a plasticizer, and press-molded with pressing rolls under a condition of a temperature of 160° C. and a pressure of 30 kg/cm² for 30 minutes. The sample having a dimension of 25 cm×25 cm was placed on a level block in an environment of 85% RH and 65° C. for 100 hours, and the curled states of the four corners were observed. An average value of the curled amounts (mm) of the four corners was measured and evaluated by the following standard. The grade A was designated as pass.
A: curled amount of less than 10 mm
C: curled amount of 10 mm or more

(12) Thickness of Coated Layer

A small piece of the film was embedded in an epoxy resin (Epomount, a trade name, produced by Refinetec Co., Ltd.), and was sliced along with the embedding resin to a thickness of 50 nm by using Microtome 2050, produced by Reichert-Jung AG, and the sample was observed with a transmission electron microscope (LEM-2000, produced by JEOL Ltd.) at an acceleration voltage of 100 kV and a magnification of 100,000 to measure the thickness of the coated layer.

(13) Average Particle Diameter

The same operation as in the measurement of the thickness of the coated layer was carried out to measure particle diameters of 100 particles, and an average value thereof was designated as the average particle diameter.

(14) Total Evaluation

According to the aforementioned evaluation results, the total evaluation was made by the following standard. The grades AA and A were designated as pass.
AA: considerably good (good in all the results with particularly excellent items)
A: good (good in all the results)
B: slightly poor (slightly insufficient items in the results)
C: poor (fatal defect in at least one of the results)

(Resin Formulation and Mixing Ratios of Components in Coated Layer)

The formulation and the mixing ratio of the coated layer used in Examples and Comparative Examples are shown in Table 1. The components constituting the coated layer were as follows.

TABLE 1

| | Formulation of coated layer (% by weight) | | | | |
| --- | --- | --- | --- | --- | --- |
| | Polyester resin | Acrylic resin | Fine particles | Wax | Wetting agent |
| Coating composition | 67 | 20 | 3 | 5 | 5 |

The polyester resin (Tg=76° C., average molecular weight: 12,000) was constituted by an acid component containing 63% by mol of 2,6-naphthalenedicarboxylic acid, 32% by mol of isophthalic acid and 5% by mol of 5-sodium sulfoisophthalate, and a glycol component containing 90% by mol of ethylene glycol and 10% by mol of diethylene glycol. The polyester resin was produced in the following manner according to the method disclosed in Example 1 of JP-A-06-116487. 42 parts of dimethyl 2,6-napthalenedicarboxylate, 17 parts of dimethyl isophthalate, 4 parts of dimethyl 5-sodium sulfoisophthalate, 33 parts of ethylene glycol and 2 parts of diethylene glycol were charged in a reactor, to which 0.05 part of tetrabutoxytitanate was added, and the mixture was heated to a temperature controlled to 230° C. under a nitrogen atmosphere to effect ester exchange reaction while distilling methanol formed. The temperature of the reaction system was gradually increased to 255° C., and the system was depressurized to 1 mmHg, so as to effect polycondensation reaction, whereby a polyester resin was obtained.

The acrylic resin (Tg=50° C.) was constituted by 30% by mol of methyl methacrylate, 30% by mol of 2-isopropenyl-2-oxazoline, 10% by mol of polyethylene oxide (n=10) methacrylate and 30% by mol of acrylamide. The acrylic resin was produced in the following manner according to the method disclosed in Production Examples 1 to 3 of JP-A-63-37167. 302 parts of ion exchanged water was charged in a four-neck flask and heated to 60° C. under a nitrogen stream, to which 0.5 part of ammonium persulfate and 0.2 part of sodium hydrogen nitrite as polymerization initiators were added, and furthermore, 23.3 parts of methyl methacrylate, 22.6 parts of 2-isopropenyl-2-oxazoline, 40.7 parts of polyethyleneoxide (n 10) methacrylic acid and 13.3 parts of acrylamide as monomers were added dropwise thereto over 3 hours while adjusting the solution temperature to 60 to 70° C. After completing the dropwise addition, the temperature was maintained in the range for 2 hours to continue the reaction under stirring, and then the system was cooled to obtain an aqueous dispersion of an acrylic resin having a solid content of 25%.

The fine particles used were composite inorganic fine particles of silica and titania (average particle diameter: 100 nm). The fine particles were produced in the following manner according to the method disclosed in Production Example and Example of JP-A-7-2520. 140 g of methanol, 260 g of isopropanol and 100 g of aqueous ammonia (25% by weight) were charged in a 4-L glass reactor equipped with stirring blades to prepare a reaction solution, which was stirred while the temperature of the reaction solution was maintained to 40° C. 542 g of silicon tetramethoxide (Si(OMe)$_4$, Methyl Silicate 39, a trade name, produced by Colcoat Co., Ltd.) was charged in a 3-L conical flask, and 195 g of methanol and 28 g of a 0.1% by weight aqueous solution of hydrochloric acid (obtained by diluting 35% hydrochloric acid, produced by Wako Pure Chemical Industries, Ltd. with water to 1/1,000) were added thereto under stirring, followed by further stirring for about 10 minutes. Subsequently, a solution obtained by diluting 300 g of titanium tetraisopropoxide (Ti(O-i-Pr)$_4$, A-1 (TPT), a trade name, produced by Nippon Soda Co., Ltd.) with 634 g of isopropanol was added thereto to obtain a transparent uniform solution (copolycondensate of silicon tetraalkoxide and titanium tetraalkoxide). 1,699 g of the uniform solution and 480 g of aqueous ammonia (25% by weight) were simultaneously added dropwise to the aforementioned reaction solution over 2 hours at a small dropping rate in the initial stage, which was gradually increased toward the final stage. After completing the dropwise addition, the resulting cohydrolyzate was filtered and dried at 50° C. to remove the organic solvents, and it was then dispersed in water to obtain fine particles having a concentration of 10% by weight and a refractive index of 1.56.

The wax used was carnauba wax (Cellosol 524, a trade name, produced by Chukyo Yushi Co., Ltd.).

The wetting agent used was polyoxyethylene (n=7) lauryl ether (Naroacty N-70, a trade name, produced by Sanyo Chemical Industries, Ltd.).

Reference Example 1

100 parts of dimethyl naphthalene-2,6-dicarboxylate and 60 parts of ethylene glycol were subjected to ester exchange reaction by using 0.03 part of manganese acetate tetrahydrate as an ester exchange catalyst at a temperature gradually increasing from 150 to 238° C. for 120 minutes. At the time during the course of reaction when the reaction temperature reached 170° C., 0.024 part of antimony trioxide was added, and after completing the ester exchange reaction, trimethyl phosphate (solution obtained by heat-treating in ethylene glycol at 135° C. for 5 hours under pressure of from 0.11 to 0.16 MPa, in an amount of 0.023 part in terms of trimethyl phosphate) was added thereto. Thereafter, the reaction product was placed in a polymerization reactor and subjected to polycondensation reaction by increasing the temperature to 290° C. under high vacuum of 27 Pa or less, so as to obtain polyethylene-2,6-naphthalene dicarboxylate having a melting point of 269° C. and an intrinsic viscosity of 0.61 dL/g and containing substantially no particle.

Pellets of the polyethylene-2,6-naphthalene dicarboxylate were dried at 170° C. for 6 hours and then fed to a hopper of an extruder. The pellets were melted at a melting temperature of 305° C., filtered through a stainless steel thin mesh filter having an average opening of 17 μm, and quenched by extruding onto a rotary cooling drum having a surface temperature of 60° C. through a slit die of 3 mm, so as to obtain an unstretched film. The resulting unstretched film was preheated at 120° C. and stretched in the longitudinal direction by 4.5 times while heating between the low speed and high speed drums from the above at a distance of 15 mm with an IR heater of 900° C. The aforementioned coating composition for a coated layer was coated on one surface of the film having been stretched in the longitudinal direction to a thickness of the dried coated film of 0.1 μm with a roll coater.

The film was then fed to a tenter and stretched in the width direction by 4.5 times at 145° C. The resulting biaxially stretched oriented polyester film was thermally fixed at a temperature of 230° C. for 40 seconds to obtain a polyester film having a thickness of 100 μm. The characteristics of the resulting film are shown in Table 2. The biaxially stretched oriented polyester film of the example was excellent in dimensional stability. It was also excellent in transparency, gas barrier property, surface flatness of the substrate layer, and electric insulating property (electric resistance characteristics).

Reference Example 2

A biaxially stretched oriented polyester film was obtained in the same manner as in Example 1 except that the stretching ratios were 3.8 times in the longitudinal direction and 3.8 times in the width direction, and the thermal fixing temperature was 200° C. The characteristics of the resulting film are shown in Table 2. The biaxially stretched oriented polyester film of the example was excellent in dimensional stability. It was also excellent in transparency, gas barrier property, surface flatness of the substrate layer, and electric insulating property (electric resistance characteristics).

Reference Example 3

A biaxially stretched oriented polyester film was obtained in the same manner as in Example 1 except that the thermal fixing temperature was 200° C. The characteristics of the resulting film are shown in Table 2. The biaxially stretched oriented polyester film of the example was excellent in dimensional stability. It was also excellent in transparency, gas barrier property, surface flatness of the substrate layer, and electric insulating property (electric resistance characteristics).

Example 4

The biaxially stretched oriented polyester film obtained in Example 3 was wound into a roll and subjected to a relaxing treatment by using a heating zone with an IR heater at a treating temperature of 160° C. and a relaxing ratio of 1.0%, so as to obtain a film. The characteristics of the resulting film are shown in Table 2. The biaxially stretched oriented polyester film of the example was excellent in dimensional stability, and in particular, it was considerably low in the coefficient of linear thermal expansion and thermal shrinkage rate. It was also excellent in transparency, gas barrier property, surface flatness of the substrate layer, and electric insulating property (electric resistance characteristics).

Reference Example 5

A biaxially stretched oriented polyester film was obtained in the same manner as in Example 1 except that the stretching ratios were 3.5 times in the longitudinal direction and 5.0 times in the width direction, and the thermal fixing temperature was 200° C. The characteristics of the resulting film are shown in Table 2. The biaxially stretched oriented polyester film of the example was excellent in dimensional stability, transparency, surface flatness of the substrate layer, and electric insulating property (electric resistance characteristics). However, it had anisotropy in the coefficient of linear thermal expansion and was slightly low in gas barrier property.

Reference Example 6

A biaxially stretched oriented polyester film was obtained in the same manner as in Example 1 except that no coated layer was provided. The characteristics of the resulting film are shown in Table 2. The biaxially stretched oriented polyester film of the example was excellent in dimensional stability and transparency. However, it was slightly low in gas barrier property due to the absence of a coated layer, and in the case where the film was used as a flexible printed circuit, it suffered wrinkles due to insufficient running property and was slightly inferior in electric insulating property.

TABLE 2

| | Example 1 | Example 2 | Example 3 | Example 4 | Example 5 | Example 6 |
|---|---|---|---|---|---|---|
| Constitution of film | | | | | | |
| Kind of polyester | PEN | PEN | PEN | PEN | PEN | PEN |
| Lubricant in oriented polyester film substrate layer | no | no | no | no | no | no |
| Coated layer | yes | yes | yes | yes | yes | no |
| Film thickness (μm) | 100 | 100 | 100 | 100 | 100 | 100 |
| Film forming conditions | | | | | | |
| Stretching ratio (MD × TD) | 4.5 × 4.5 | 3.8 × 3.8 | 4.5 × 4.5 | 4.5 × 4.5 | 3.5 × 5.0 | 4.5 × 4.5 |
| Thermal fixing temperature (° C.) | 230 | 200 | 200 | 200 | 200 | 230 |
| Thermal relaxing treatment | no | no | no | yes | no | no |
| Film characteristics | | | | | | |
| Thermal shrinkage rate (100° C. × 10 minutes) (%) | | | | | | |
| MD | 0.1 | 0.2 | 0.3 | 0.05 | 0.1 | 0.1 |
| TD | 0.08 | 0.15 | 0.2 | 0.01 | 0.25 | 0.08 |
| Thermal shrinkage rate (150° C. × 30 minutes) (%) | | | | | | |
| MD | 0.9 | 2.2 | 2.9 | 1.7 | 1.4 | 0.9 |
| TD | 0.7 | 1.9 | 3.1 | 1.3 | 4.0 | 0.7 |
| Coefficient of linear thermal expansion αt (ppm/° C.) | | | | | | |
| MD | 10 | 8 | 6 | 6 | 13 | 10 |
| TD | 12 | 7 | 7 | 8 | 5 | 12 |
| Surface roughness SRa (nm) | | | | | | |
| Rough surface | 11 | 11 | 11 | 11 | 11 | 4 |
| Flat surface | 4 | 4 | 3 | 3 | 3 | 4 |
| Ten-point average roughness Rz (nm) | | | | | | |
| Rough surface | 100 | 100 | 100 | 100 | 100 | 12 |
| Flat surface | 12 | 12 | 12 | 12 | 12 | 12 |
| Total light transmittance (%) | 87 | 87 | 87 | 87 | 87 | 87 |
| Haze (%) | 0.9 | 0.75 | 0.8 | 0.85 | 0.8 | 0.8 |
| Film flatness | A | A | A | A | A | A |
| Water absorption rate (%) | 0.3 | 0.3 | 0.3 | 0.3 | 0.3 | 0.3 |
| Gas barrier property | AA | A | A | AA | B | B |
| Electric insulating property | A | A | A | A | A | B |
| Total evaluation | AA | A | A | AA | B | B |

Comparative Example 1

A biaxially stretched oriented polyester film was obtained in the same manner as in Example 1 except that the stretching ratios were 3.1 times in the longitudinal direction and 3.3 times in the width direction. The characteristics of the resulting film are shown in Table 3. The biaxially stretched oriented polyester film of the comparative example was excellent in transparency, surface flatness of the substrate layer, and electric insulating property (electric resistance characteristics), but had a large coefficient of linear thermal expansion. It also had insufficient gas barrier property.

Comparative Example 2

A biaxially stretched oriented polyester film was obtained in the same manner as in Example 1 except that the stretching ratios were 3.1 times in the longitudinal direction and 3.2 times in the width direction, the thermal fixing temperature was 240° C., the thermal relaxing treatment temperature was 220° C., and the relaxing ratio was 0.5%. The relaxing treatment was carried out in such a manner that the biaxially stretched oriented polyester film after thermally fixed was wound into a roll and subjected to the treatment by using a heating zone with an IR heater. The characteristics of the resulting film are shown in Table 3. The biaxially stretched oriented polyester film of the comparative example was excellent in transparency, surface flatness of the substrate layer, and electric insulating property (electric resistance characteristics), but with respect to dimensional stability, had a large coefficient of linear thermal expansion although the thermal shrinkage rate was small. It also had insufficient gas barrier property.

Comparative Example 3

A biaxially stretched oriented polyester film was obtained in the same manner as in Example 1 except that spherical silica particles having an average particle diameter of 0.35 μm were mixed in an amount of 0.1% by weight with polyethylene-2,6-naphthalene dicarboxylate used in Example 1, the thermal fixing temperature was 180° C., the film thickness was 25 μm, and no coated layer was provided. The characteristics of the resulting film are shown in Table 3. The biaxially stretched oriented polyester film of the comparative example was low in thermal fixing temperature and was large in thermal shrinkage rate. The resulting film was an opaque film having a high haze and a low total light transmittance due to the lubricant contained in the substrate layer containing polyethylene-2,6-naphthalene dicarboxylate. It was poor in gas barrier property, was inferior in surface flatness of the substrate layer, and was slightly poor in electric insulating property.

Comparative Example 4

A biaxially stretched oriented polyester film was obtained in the same manner as in Comparative Example 3 except that the stretching ratios were 3.7 times in the longitudinal direction and 4.0 times in the width direction, the thermal fixing temperature was 230° C., and the film thickness was 100 μm. The characteristics of the resulting film are shown in Table 3. The resulting film was an opaque film having a high haze and a low total light transmittance due to the lubricant contained in the substrate layer containing polyethylene-2,6-naphthalene dicarboxylate. It was poor in gas barrier property, was inferior in surface flatness of the substrate layer, and was slightly poor in electric insulating property.

Comparative Example 5

A biaxially stretched oriented polyester film was obtained in the same manner as in Example 1 except that the stretching ratios were 3.7 times in the longitudinal direction and 4.0 times in the width direction, and the thermal fixing temperature was 240° C. The characteristics of the resulting film are shown in Table 3. The biaxially stretched oriented polyester film of the example was excellent in transparency but had a large coefficient of linear thermal expansion. It also had insufficient gas barrier property, and was slightly poor in electric insulating property.

Comparative Example 6

96 parts of methyl terephthalate, 58 parts of ethylene glycol, 0.038 part of manganese acetate and 0.041 part of antimony trioxide were charged in a reactor and subjected to ester exchange reaction under stirring until the inner temperature reached 240° C. while distilling methanol, and after completing the ester exchange reaction, 0.097 part of trimethyl phosphate was added thereto. Subsequently, the temperature of the reaction product was increased to carry out finally polycondensation under conditions of high vacuum and 280° C., whereby polyethylene terephthalate chips having a melting point of 256° C. and an intrinsic viscosity ([η]) of 0.64 dL/g and containing substantially no particle were obtained.

The polyethylene terephthalate chips were dried at 160° C. for 3 hours and then fed to a hopper of an extruder. The chips were melted at a melting temperature of 295° C., and quenched on a cooling drum maintained at 20° C., so as to obtain an unstretched film. The resulting unstretched film was stretched in the longitudinal direction by 3.6 times at 95° C., and the same coating composition as in Example 1 was coated on the lower surface thereof and subsequently on the upper surface thereof to a thickness after drying of 0.1 μm. The film was then stretched in the width direction by 3.8 times at 110° C. and subjected to a heat treatment at 230° C. to obtain a biaxially stretched oriented film having a thickness of 100 μm. The characteristics of the resulting film are shown in Table 3. The biaxially stretched oriented polyester film of the comparative example was good in transparency but was a film with poor dimensional stability having a large coefficient of linear thermal expansion and a large shrinkage rate at 150° C. It was also insufficient in gas barrier property and electric insulating property.

Comparative Example 7

A 50 μm film of Kapton Type H, produced by Du Pont Toray Co., Ltd. was used. The characteristics of the resulting film are shown in Table 3. The film had a large coefficient of linear thermal expansion although the thermal shrinkage rate was small. It was inferior in surface flatness and transparency, and was film flatness in a high humidity atmosphere due to the high water absorption rate.

TABLE 3

| | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Constitution of film | | | | | | | |
| Kind of polyester | PEN | PEN | PEN | PEN | PEN | PET | PI |
| Lubricant in oriented polyester film substrate layer | no | no | yes | yes | no | no | — |
| Coated layer | yes | yes | no | no | yes | yes | no |
| Film thickness (μm) | 100 | 100 | 25 | 100 | 100 | 100 | 50 |
| Film forming conditions | | | | | | | |
| Stretching ratio (MD × TD) | 3.1 × 3.3 | 3.1 × 3.2 | 4.5 × 4.5 | 3.7 × 4.0 | 3.7 × 4.0 | 3.6 × 3.8 | — |
| Thermal fixing temperature (° C.) | 230 | 240 | 180 | 230 | 240 | 230 | — |
| Thermal relaxing treatment | no | yes | no | no | no | no | — |
| Film characteristics | | | | | | | |
| Thermal shrinkage rate (100° C. × 10 minutes) (%) | | | | | | | |
| MD | 0.08 | 0.05 | 0.54 | 0.12 | 0.06 | 0.08 | 0.05 |
| TD | 0.05 | 0.01 | 0.48 | 0.1 | 0.04 | 0.02 | 0.03 |
| Thermal shrinkage rate (150° C. × 30 minutes) (%) | | | | | | | |
| MD | 0.3 | 0.1 | 4.0 | 0.35 | 0.25 | 0.5 | 0.2 |
| TD | 0.2 | −0.08 | 4.3 | 0.3 | 0.2 | 0.4 | 0.1 |
| Coefficient of linear thermal expansion αt (ppm/° C.) | | | | | | | |
| MD | 18 | 21 | 3 | 14 | 17 | 20 | 20 |
| TD | 20 | 24 | 4 | 16 | 19 | 22 | 18 |
| Surface roughness SRa (nm) | | | | | | | |
| Rough surface | 11 | 11 | 21 | 21 | 11 | 11 | 30 |
| Flat surface | 4 | 4 | 21 | 21 | 4 | 3 | 30 |
| Ten-point average roughness Rz (nm) | | | | | | | |
| Rough surface | 100 | 100 | 70 | 70 | 100 | 100 | 82 |
| Flat surface | 12 | 12 | 70 | 70 | 12 | 12 | 82 |
| Total light transmittance (%) | 87 | 87 | 84 | 79 | 87 | 90 | 60 |
| Haze (%) | 0.7 | 0.8 | 13 | 29 | 0.9 | 0.7 | 0.9 |
| Film flatness | A | A | A | A | A | C | C |
| Water absorption rate (%) | 0.3 | 0.3 | 0.3 | 0.3 | 0.3 | 0.4 | 1.3 |
| Gas barrier property | C | C | C | C | C | C | C |
| Electric insulating property | A | A | B | B | B | C | C |
| Total evaluation | C | C | C | C | C | C | C |

INDUSTRIAL APPLICABILITY

The oriented polyester film of the invention is excellent in dimensional stability at a high temperature and dimensional stability to temperature change in a working temperature range, and therefore it is favorably used as a flexible electronics device substrate. The flexible electronics device of the invention has a small difference in dimensional change between the substrate containing the oriented polyester film and the functional layers to decrease deterioration in functionality of the functional layers due to temperature change, and therefore it can be a substitute of a conventional glass substrate and is favorably used as a flexible electronics device demanded to have a low-profile, a curved shape and flexibility.

The oriented polyester film has dimensional stability at a high temperature and dimensional stability to temperature change in a working temperature range, and furthermore is significantly flat on the surface of the film for forming a circuit, and therefore it is excellent in electric resistance characteristics upon laminating, for example, a copper foil on the surface of the film to provide a circuit having a fine pitch with a line/space distance of 25 μm/25 μm or less, whereby a high density flexible printed circuit board can be provided.

The invention claimed is:

1. An oriented polyester film stretched in at least one direction, comprising as a major component of a substrate layer polyethylene-2,6-naphthalene dicarboxylate and having a film thickness of from 12 to 250 μm, characterized in that
    (1) a coefficient of linear thermal expansion αt at a temperature of from 30 to 100° C. is from 0 to 10 ppm/° C. in both longitudinal and width directions of the film,
    (2) a thermal shrinkage rate at 100° C. for 10 minutes is 0.05% or less in both longitudinal and width directions of the film,
    wherein the film has a thermal shrinkage rate at 150° C. for 30 minutes of 2.0% or less in both the longitudinal direction and the width direction, and
    wherein the film has a total light transmittance of the film of 85% or more and a haze of 1.5% or less, wherein the film has a coated layer at least on one surface of the substrate layer, and wherein the film has a ten-point average roughness Rz on an outer surface of the substrate layer of from 2 to 30 nm, and a ten-point average roughness Rz on an outer surface of the coated layer of from 50 to 150 nm.

2. The oriented polyester film according to claim 1, wherein the film has an absolute value of a difference between the coefficient of linear thermal expansion in the longitudinal direction ($\alpha t_{MD}$) and the coefficient of linear thermal expansion in the width direction ($\alpha t_{TD}$), $|\alpha t_{MD} - \alpha t_{TD}|$, of from 0 to 5 ppm/°C.

3. The oriented polyester film according to claim 1, wherein the film has a three-dimensional center line average roughness SRa on one surface of the film of from 5 to 20 nm.

4. The oriented polyester film according to claim 3, wherein the film has a three-dimensional center line average roughness SRa on the other surface of the film of from 0 to 5 nm.

5. The oriented polyester film according to claim 1, wherein the coated layer comprises a polymer binder and fine particles having the same refractive index as the polymer binder.

6. The oriented polyester film according to claim 1, wherein the film further comprises a hardcoat layer or a sticky agent layer laminated on the coated layer.

7. A flexible electronics device substrate comprising the oriented polyester film according to claim 1.

8. A flexible electronics device comprising a flexible electronics device substrate according to claim 7 and at least one layer selected from the group consisting of a gas barrier layer, a conductor layer, a semiconductor layer and a luminescent layer laminated on the flexible electronics device substrate.

9. The flexible electronics device according to claim 8, wherein the device is a liquid crystal display, an organic EL display, electronics paper, a dye sensitized solar cell or a flexible printed circuit.

10. A flexible printed circuit board comprising an oriented polyester film according to claim 1 and a copper foil or a conductive paste laminated on the surface of the oriented polyester film to form a circuit pattern, and having an insulating resistance value of the circuit pattern upon continuously applying a direct current voltage (DC) of 100 V in an environment of 85° C. and 85%RH satisfying the following equation (I)

$$R_{1000}/R_0 \geq 0.7 \tag{I}$$

in the equation, $R_{1000}$ represents an insulating resistance value (unit: MΩ) after continuously applying DC 100 V for 1,000 hours, and $R_0$ represents the initial insulating resistance value (unit: MΩ).

11. The oriented polyester film according to claim 1, wherein the substrate layer contains no inert particles.

* * * * *